(12) United States Patent
Ando et al.

(10) Patent No.: US 8,629,528 B2
(45) Date of Patent: Jan. 14, 2014

(54) SEMICONDUCTOR MEMORY DEVICE AND METHOD FOR MANUFACTURING THE SAME

(75) Inventors: Kyoko Ando, Yokohama (JP); Satoshi Nagashima, Yokohama (JP); Kenji Aoyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/557,295

(22) Filed: Jul. 25, 2012

(65) Prior Publication Data

US 2013/0020629 A1 Jan. 24, 2013

Related U.S. Application Data

(63) Continuation of application No. 12/350,658, filed on Jan. 8, 2009, now Pat. No. 8,253,199.

(30) Foreign Application Priority Data

Feb. 18, 2008 (JP) ................................ 2008-036082

(51) Int. Cl.
*H01L 21/70* (2006.01)

(52) U.S. Cl.
USPC ................... 257/522; 257/341; 257/E27.084

(58) Field of Classification Search
USPC .................. 257/341, E27.084, E27.097, 522
See application file for complete search history.

(56) References Cited

U.S. PATENT DOCUMENTS 5,847,464 A * 12/1998 Singh et al. ................... 257/752
5,882,973 A *  3/1999 Gardner et al. ............... 438/279

| | | | |
|---|---|---|---|
| 6,828,624 B1 | 12/2004 | Goda et al. | |
| 7,233,052 B2 * | 6/2007 | Tamaoka et al. ............. | 257/522 |
| 2003/0085421 A1 | 5/2003 | Takeuchi et al. | |
| 2006/0001073 A1 | 1/2006 | Chen et al. | |
| 2006/0231884 A1 | 10/2006 | Yonemochi et al. | |
| 2006/0258092 A1 | 11/2006 | Sato | |

(Continued)

FOREIGN PATENT DOCUMENTS

| JP | 2001-111051 | 4/2001 |
|---|---|---|
| JP | 2006-191017 | 7/2006 |
| JP | 2007-157855 | 6/2007 |

OTHER PUBLICATIONS

Notification of Reasons for Rejection issued by the Japanese Patent Office on Jul. 2, 2010, for Japanese Patent Application No. 2008-036082, and English-language translation thereof.

*Primary Examiner* — Thao Le
*Assistant Examiner* — Allen Parker
(74) *Attorney, Agent, or Firm* — Finnegan, Henderson, Farabow, Garrett & Dunner, L.L.P.

(57) ABSTRACT

According to one embodiment, a semiconductor memory device includes a plurality of word lines formed on a semiconductor substrate at predetermined intervals, selecting transistors arranged on at least one side of the plurality of word lines, an interlayer insulating film formed to cover upper surfaces of the word lines and the selecting transistors, a first air gap located between each pair of adjacent ones of the word lines and covered by the interlayer insulating film, a second air gap located at a first side wall portion of a word line adjacent to the selecting transistors covered by the interlayer insulating film, the first side wall portion facing the selecting transistors, and a third air gap located at a second side wall portion of each of the selecting transistors and covered by the interlayer insulating film. The first, second, and third air gaps are filled with air.

7 Claims, 18 Drawing Sheets

(56) References Cited

U.S. PATENT DOCUMENTS

| | | |
|---|---|---|
| 2007/0063256 A1 | 3/2007 | Imai et al. |
| 2007/0257305 A1 | 11/2007 | Sasago et al. |
| 2008/0044979 A1 | 2/2008 | Wells et al. |
| 2008/0099876 A1* | 5/2008 | Seto .............................. 257/522 |
| 2009/0096007 A1 | 4/2009 | Omura et al. |

* cited by examiner

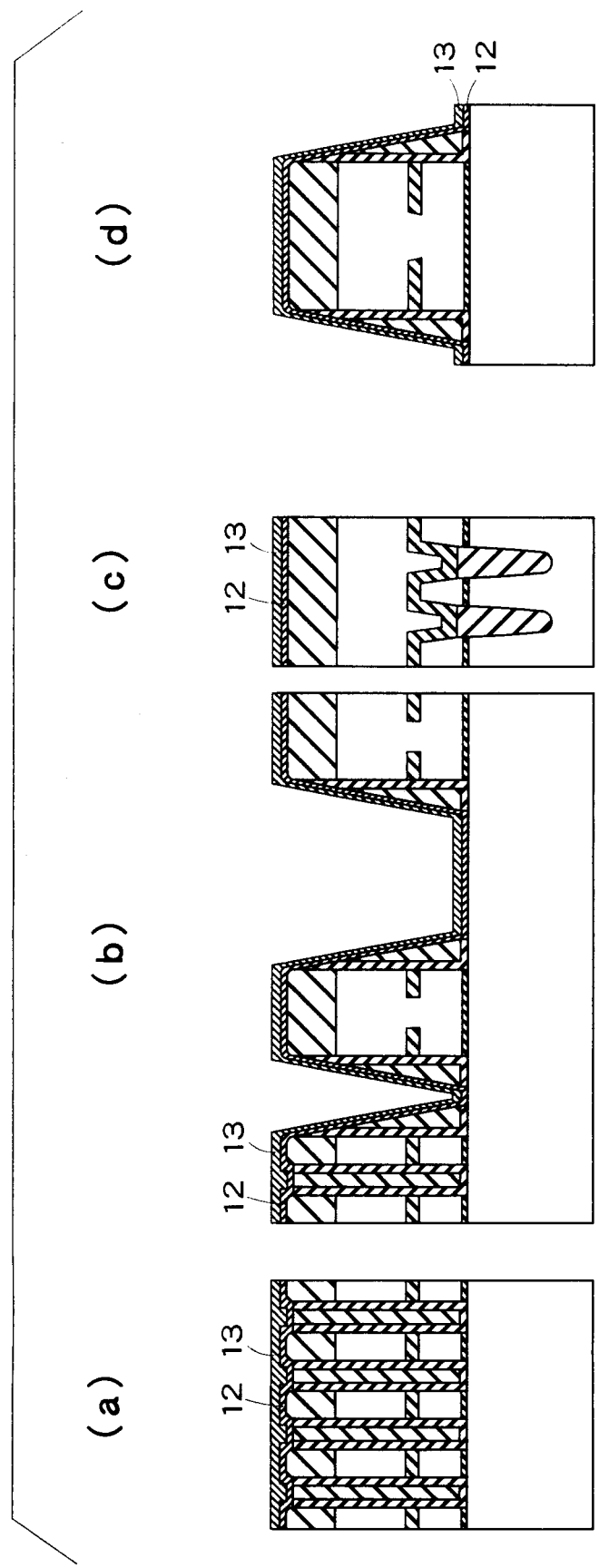
F I G. 3

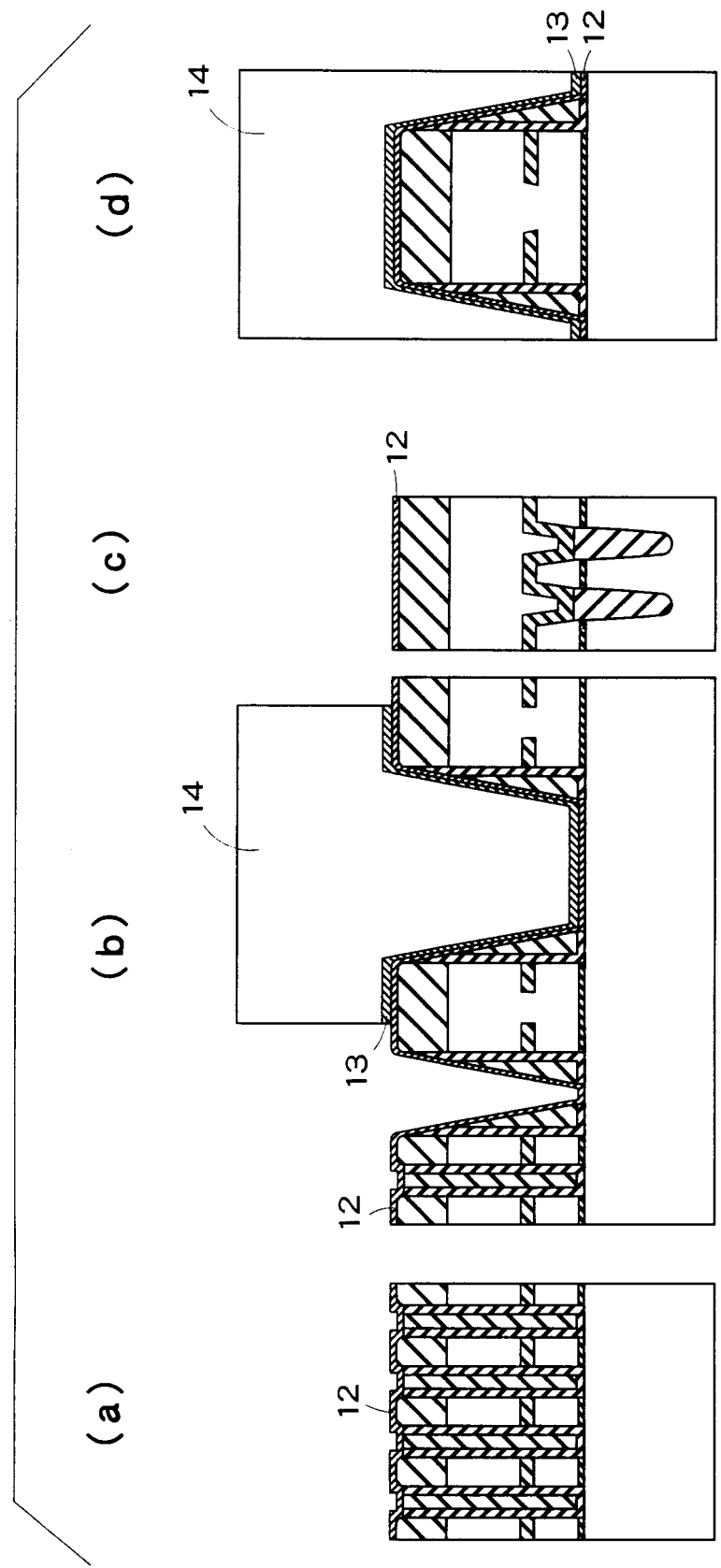
F I G. 5

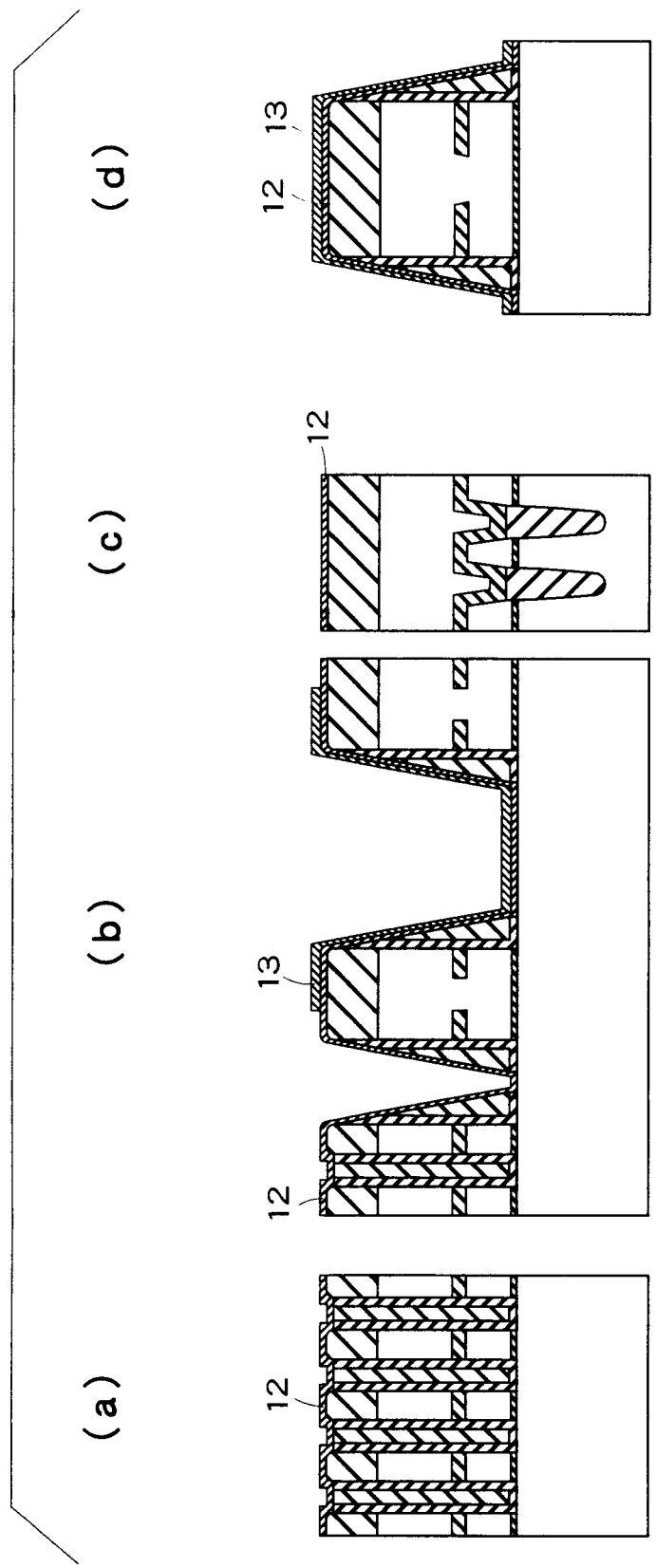
F I G. 6

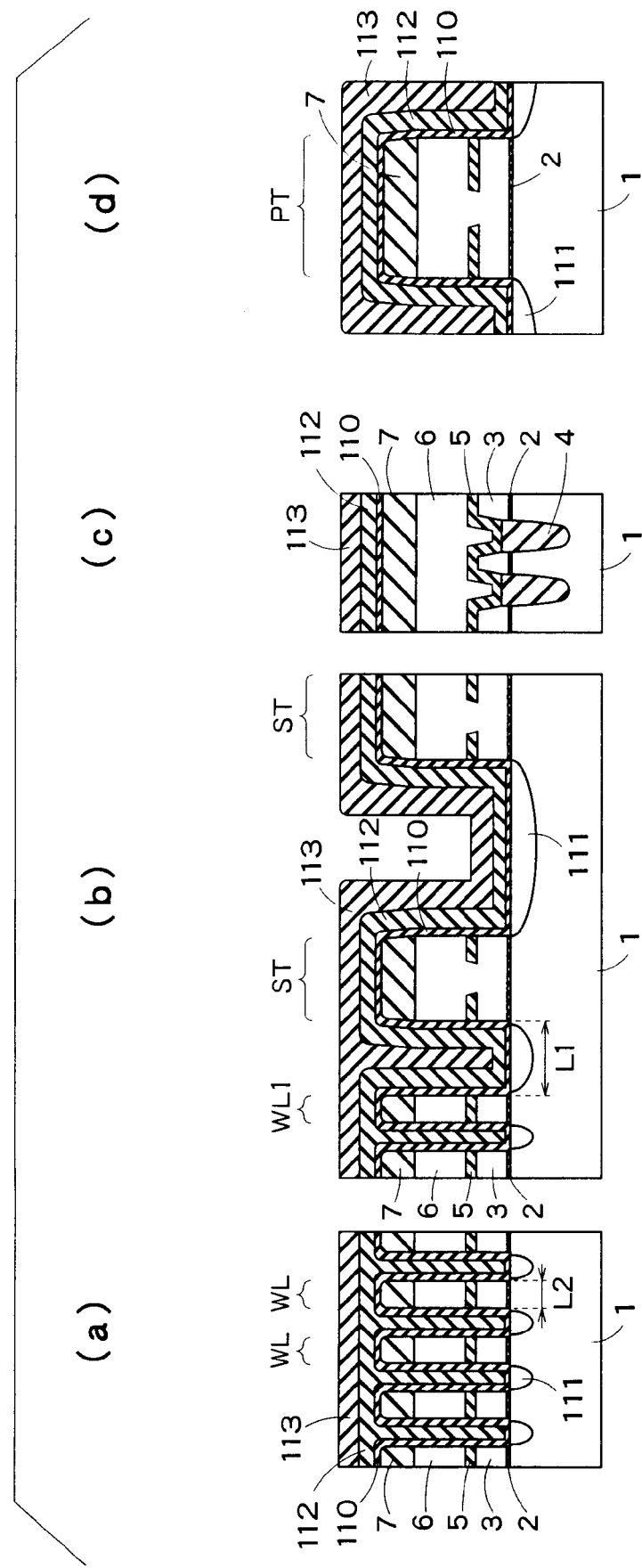
F I G. 12

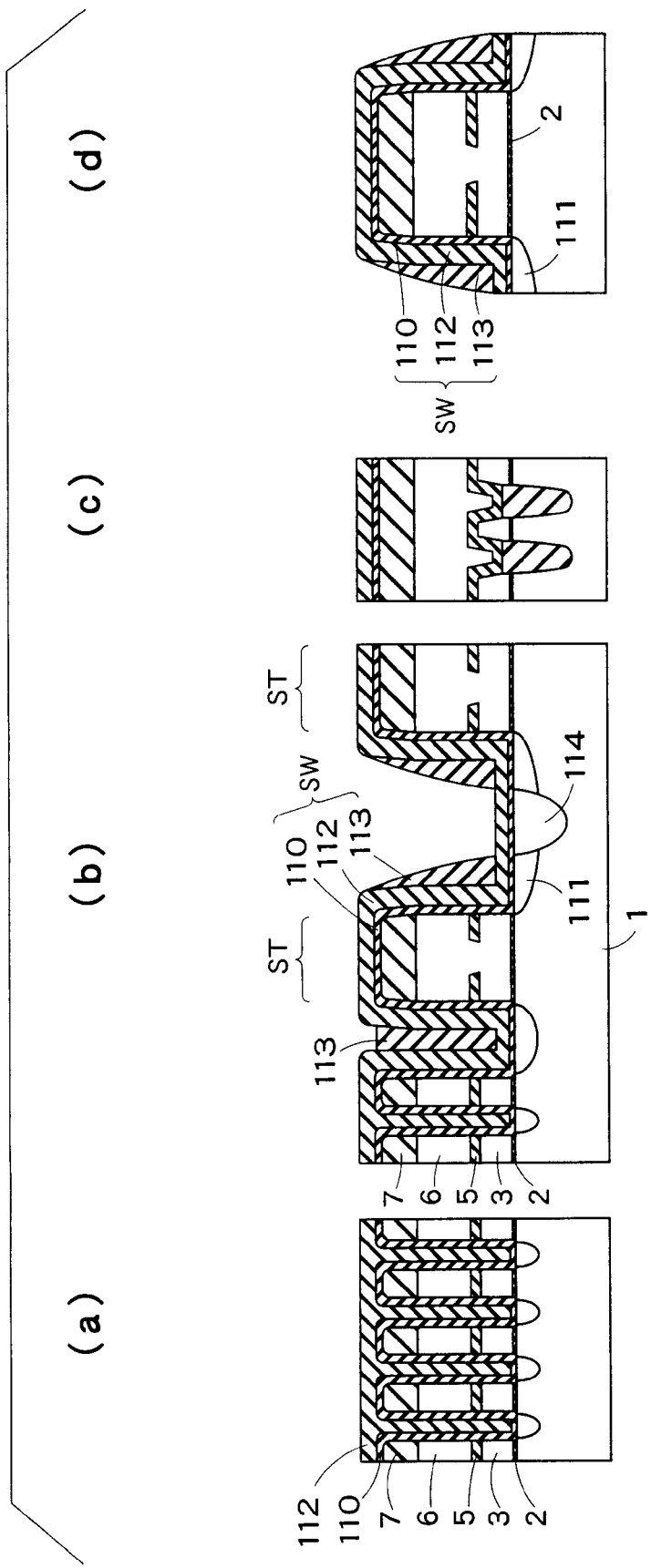
F I G. 13

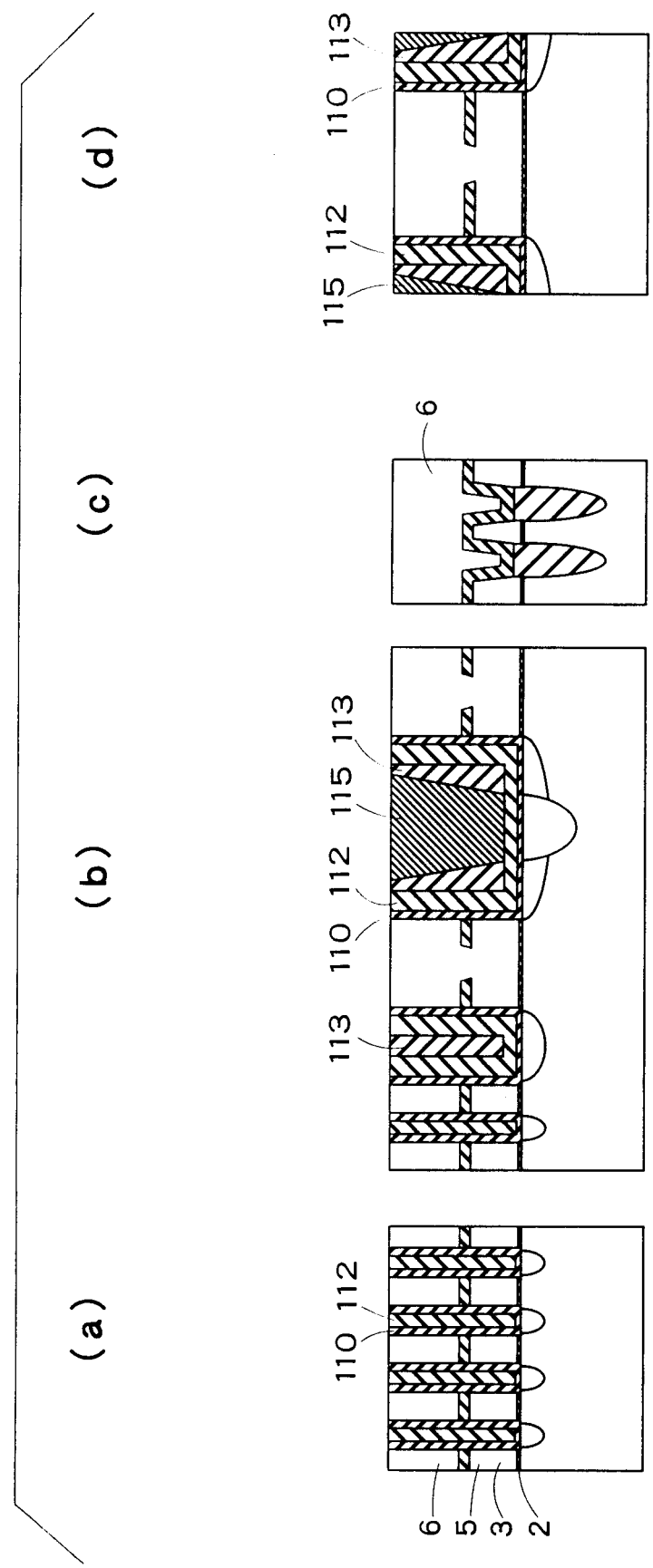
F I G. 15

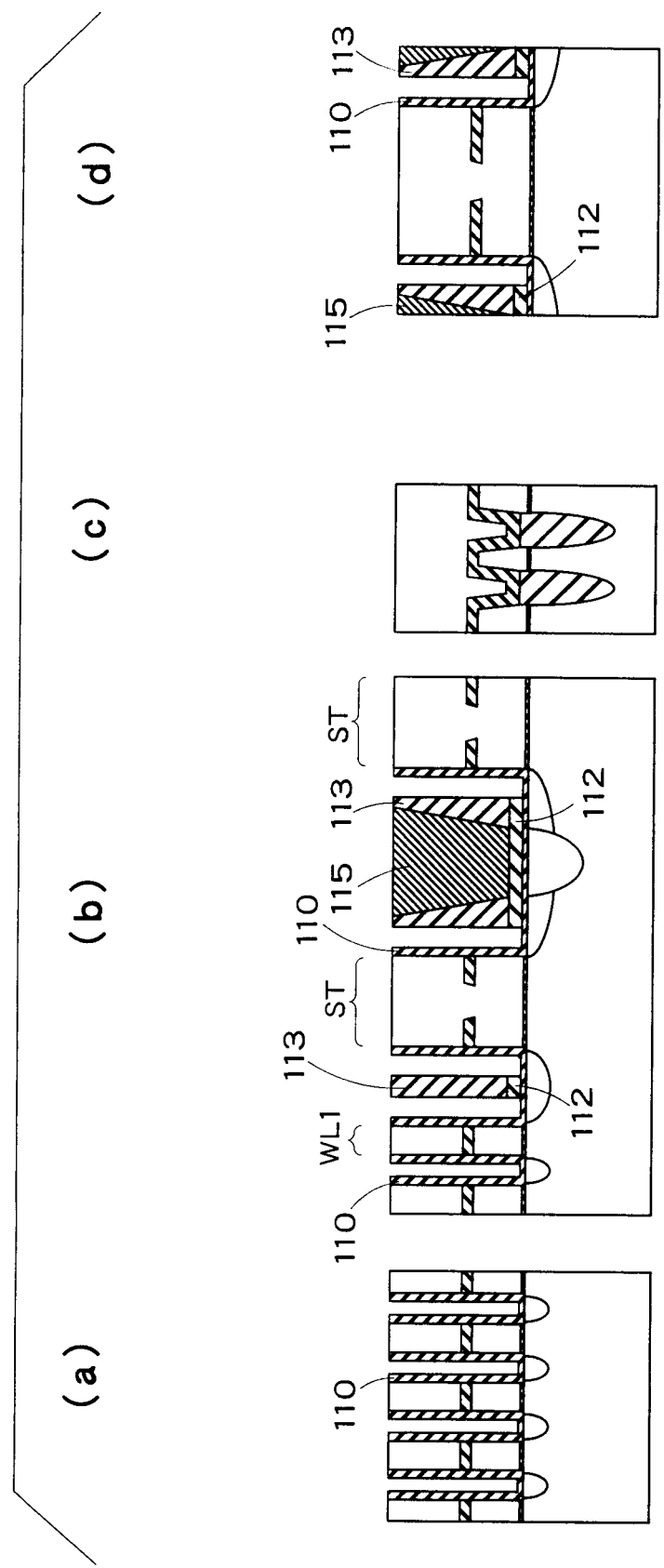
F I G. 16

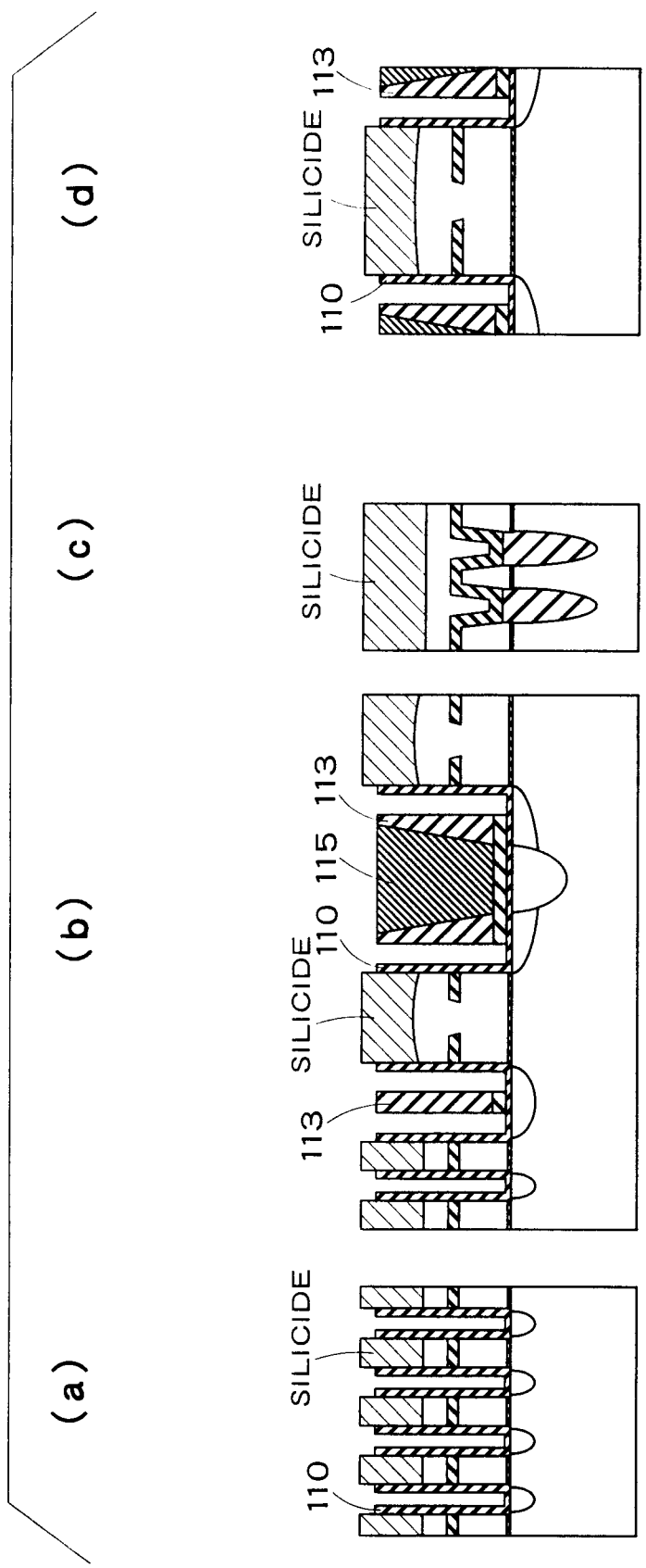
F I G. 17

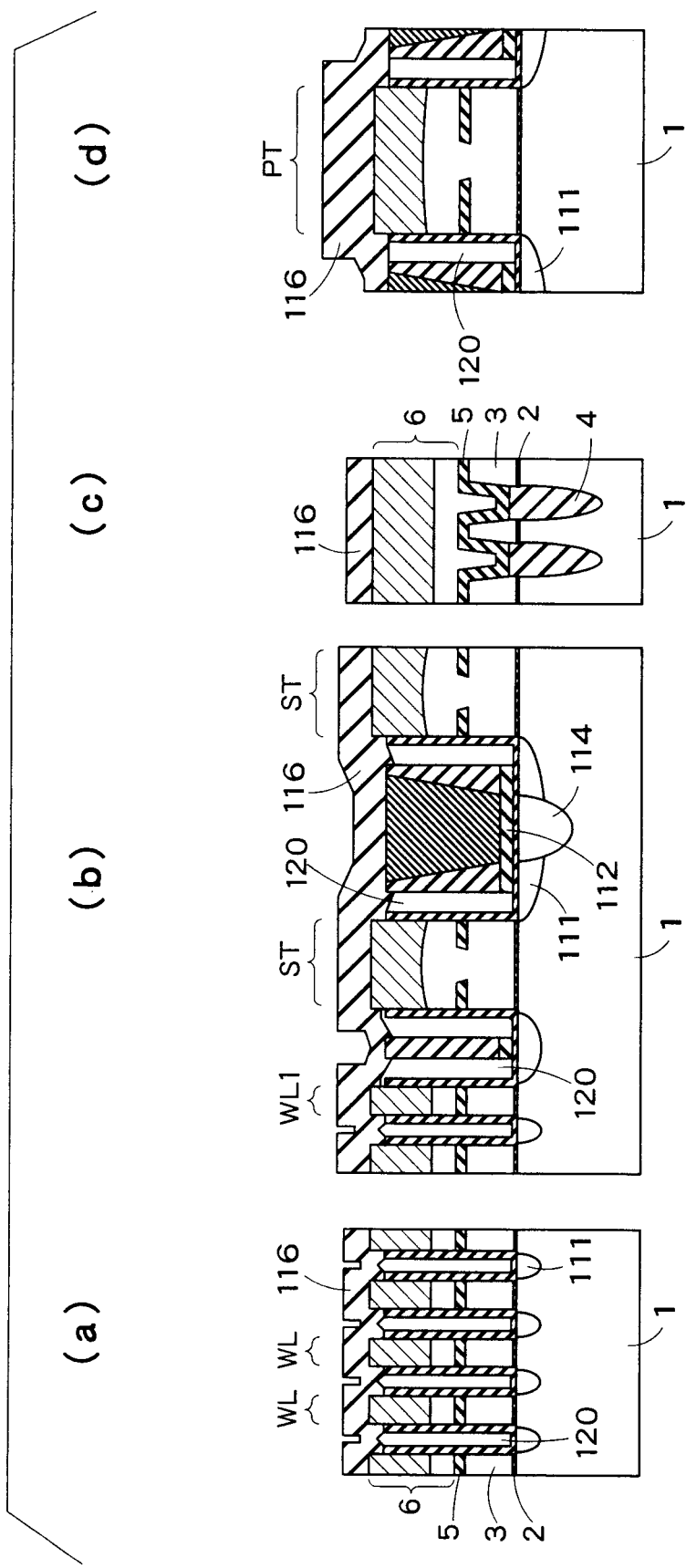
F I G. 18

SEMICONDUCTOR MEMORY DEVICE AND METHOD FOR MANUFACTURING THE SAME

CROSS REFERENCE TO RELATED APPLICATION

This is a continuation of application Ser. No. 12/350,658, filed Jan. 8, 2009, U.S. Pat. No. 8,253,199 which is incorporated herein by reference.

This application is based upon and claims benefit of priority from the Japanese Patent Application No. 2008-36082, filed on Feb. 18, 2008, the entire contents of which are incorporated herein by reference.

BACKGROUND OF THE INVENTION

The present invention relates to a semiconductor memory device and a method for manufacturing the same.

In a conventional nonvolatile semiconductor memory device, a space between word lines is filled with an oxide film or a nitride film. However, along with miniaturization of elements, the spacing between word lines becomes shorter, and parasitic capacitance generated between floating gate electrodes of adjacent word lines or between a floating gate and a diffusion layer reduces writing speed.

In order to solve the above-described problem, there has been proposed the process of reducing parasitic capacitance by depositing an oxide film with a poor filling ability on and between word lines and providing an air gap (cavity) between adjacent floating gate electrodes.

The spacing between a selecting gate transistor and a word line adjacent thereto (hereinafter referred to as an end WL) needs to be larger than that between word lines for the following two purposes. The first purpose is to leave an offset space between a diffusion layer region formed at the surface of a part of a substrate between the selecting gate and the end WL and an end (side surface) of the selecting gate and prevent an abnormal cutoff of the selecting gate due to a GIDL (gate inducted drain leakage) flowing between a gate and a drain which is generated upon extension of a depletion layer from the diffusion layer region when the gate voltage of the selecting gate becomes negative.

The second purpose is to secure an alignment tolerance for a resist having an opening corresponding to a memory cell array portion and covering a selecting gate region at the time of performing double patterning in order to form a memory cell array. Examples of double patterning include a method for realizing double-fineness circuit pattern drawing by preparing two masks bearing staggered circuit patterns, exposing one wafer twice using the two masks, and overlaying one circuit on another in a staggered configuration and a method for realizing a micropattern at a lower layer using side wall films formed at side walls of a formed dummy pattern.

If a conventional air gap forming method as described above is applied to a semiconductor memory device in which the spacing between each selecting gate transistor and the corresponding end WL is long, it is impossible to form an air gap between the selecting gate transistor and the end WL.

For this reason, parasitic capacitance (parasitic fringe capacitance) generated between each end WL and a corresponding diffusion layer cannot be reduced, and the writing speed of the end WL cannot be improved.

SUMMARY OF THE INVENTION

According to one aspect of the present invention, there is provided a semiconductor memory device comprising:

a semiconductor substrate;

a plurality of word lines formed on the semiconductor substrate at predetermined intervals, each having a first insulating film, a charge accumulating layer, a second insulating film, and a controlling gate electrode stacked in sequence;

a selecting transistor arranged on each of two sides of each of the plurality of word lines in which a spacing between the selecting transistor and an adjacent one of the word lines is not less than three times a width of each of the word lines;

an interlayer insulating film formed to cover upper surfaces of the word lines and selecting transistors;

a first cavity portion which is located between each pair of adjacent ones of the word lines and whose upper portion is covered with the interlayer insulating film;

a second cavity portion which is formed at a side wall portion of the word line adjacent to each selecting transistor which faces the selecting transistor and whose upper portion is covered with the interlayer insulating film; and a third cavity portion which is formed at a side wall portion of each of the selecting transistors and whose upper portion is covered with the interlayer insulating film.

According to one aspect of the present invention, there is provided a semiconductor memory device manufacturing method wherein a plurality of memory regions, each of which has a plurality of word lines formed at predetermined intervals, each having a first insulating film, a charge accumulating layer, a second insulating film, and a controlling gate electrode stacked in sequence, a selecting transistor arranged on each of two sides of each of the plurality of word lines in which a spacing between the selecting transistor and an adjacent one of the word lines is not less than three times a width of each of the word lines are adjacently formed on a semiconductor substrate, a first oxide film is formed to cover the word lines, selecting transistors, and semiconductor substrate, a nitride film is formed on the first oxide film to fill a space between each pair of adjacent ones of the word lines with the nitride film, the nitride film and first oxide film are partially removed such that a surface of a part of the semiconductor substrate between each pair of adjacent ones of the selecting transistors and a surface of a part of the semiconductor substrate between each of the selecting transistors and the word line adjacent to the selecting transistor are exposed to form a side wall film composed of the first oxide film and nitride film at each of side wall portions of each of the selecting transistors and a side wall portion of the word line adjacent to each of the selecting transistors which faces the selecting transistor, a second oxide film is formed to fill a space between each pair of adjacent ones of the selecting transistors and a space between each of the selecting transistors and the word line adjacent to the selecting transistor with the second oxide film, the second oxide film is partially removed such that an upper surface of each controlling gate electrode and an upper portion of a piece of the nitride film included in each of the side wall films are exposed, a piece of the nitride film between each pair of adjacent ones of the word lines and a piece of the nitride film included in each of the side wall films are removed, and a third oxide film is formed to lie over a region from which the pieces of the nitride film have been removed.

According to one aspect of the present invention, there is provided a semiconductor memory device manufacturing method wherein a plurality of memory regions, each of which has a plurality of word lines formed at predetermined intervals, each having a first insulating film, a charge accumulating layer, a second insulating film, and a controlling gate electrode stacked in sequence, a selecting transistor arranged on each of two sides of each of the plurality of word lines in which a spacing between the selecting transistor and an adjacent one of the word lines is not less than three times a width of each of the word lines are adjacently formed on a semiconductor substrate, a first oxide film is formed to cover the word lines, selecting transistors, and semiconductor substrate, a first diffusion layer is formed at each of a surface of a part of the semiconductor substrate between each pair of adjacent ones of the word lines, a surface of a part of the semiconductor substrate between each pair of adjacent ones of the selecting transistors, and a surface of a part of the semiconductor substrate between each of the selecting transistors and the word line adjacent to the selecting transistor, a nitride film is formed on the first oxide film to fill a space between each pair of adjacent ones of the word lines with the nitride film, a second oxide film is formed on the nitride film to fill a space between each of the selecting transistors and the word line adjacent to the selecting transistor with the second oxide film, the second oxide film is partially removed such that an upper surface of a piece of the nitride film between each pair of adjacent ones of the selecting transistors is exposed to form a side wall film composed of the second oxide film, nitride film, and first oxide film at a side wall portion of each of the adjacent ones of the selecting transistors which is between the adjacent ones of the selecting transistors, a second diffusion layer is formed at a surface of a part of the semiconductor substrate between each pair of adjacent ones of the selecting transistors using the corresponding side wall films as a mask, a third oxide film is formed to fill a space between each pair of adjacent ones of the selecting transistors, the third oxide film, second oxide film, nitride film, and first oxide film are partially removed such that an upper surface of each of the controlling gate electrodes is exposed, a piece of the nitride film between each pair of adjacent ones of the word lines, a piece of the nitride film included in the side wall portion of each of the adjacent ones of the selecting transistors, and a piece of the nitride film at a side wall portion of the word line adjacent to each of the selecting transistors which faces the selecting transistor are removed, and a fourth oxide film is formed to lie over a region from which the pieces of the nitride film have been removed.

BRIEF DESCRIPTION OF THE DRAWINGS

FIG. 3 is a sectional view showing a step subsequent to FIG. 2;

FIG. 5 is a sectional view showing a step subsequent to FIG. 4;

FIG. 6 is a sectional view showing a step subsequent to FIG. 5;

FIG. 12 is a sectional view for explaining a method of manufacturing a semiconductor memory device according to a second embodiment of the present invention;

FIG. 13 is a sectional view showing a step subsequent to FIG. 12;

FIG. 15 is a sectional view showing a step subsequent to FIG. 14;

FIG. 16 is a sectional view showing a step subsequent to FIG. 15;

FIG. 17 is a sectional view showing a step subsequent to FIG. 16; and

FIG. 18 is a sectional view showing a step subsequent to FIG. 17.

DESCRIPTION OF THE EMBODIMENTS

Embodiments of the present invention will be described below with reference to the drawings.

First Embodiment

Figure 1:
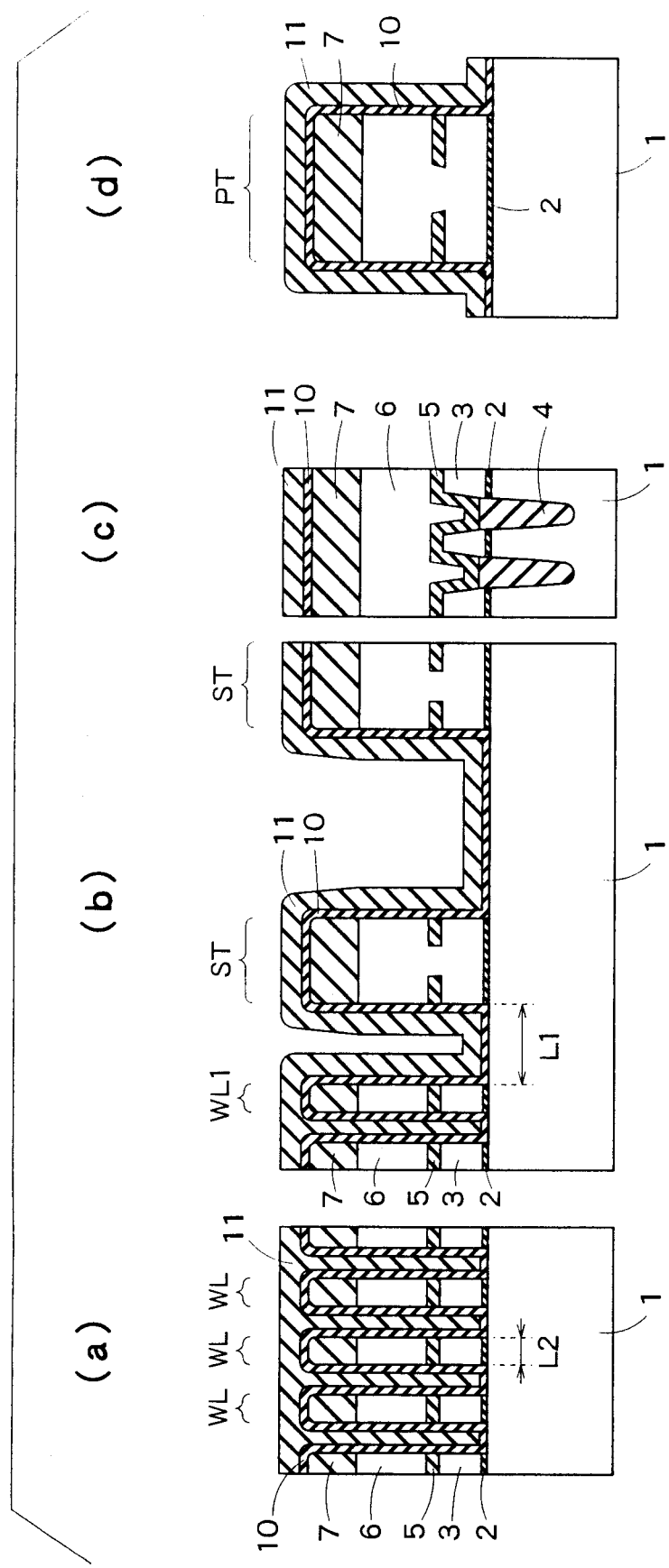
FIG. 1 is a sectional view for explaining a method of manufacturing a semiconductor memory device according to a first embodiment of the present invention.
Figure 2:
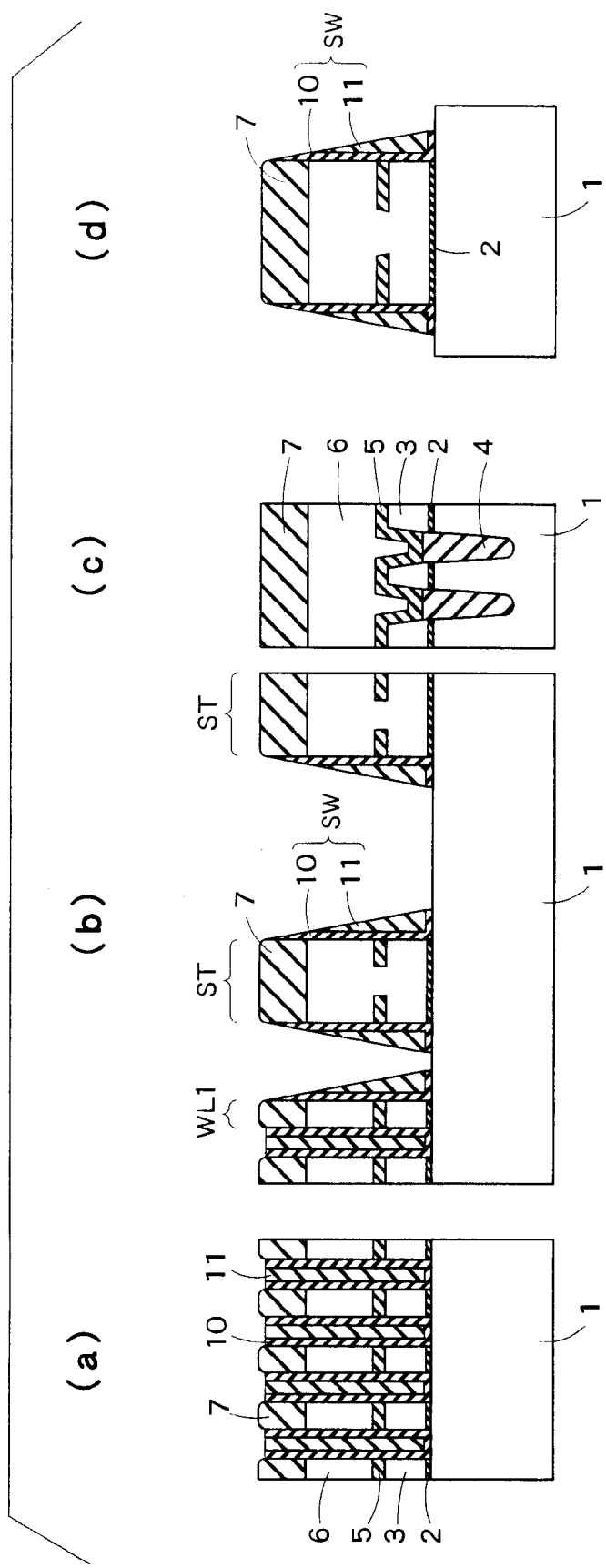
FIG. 2 is a sectional view showing a step subsequent to FIG. 1.
Figure 4:
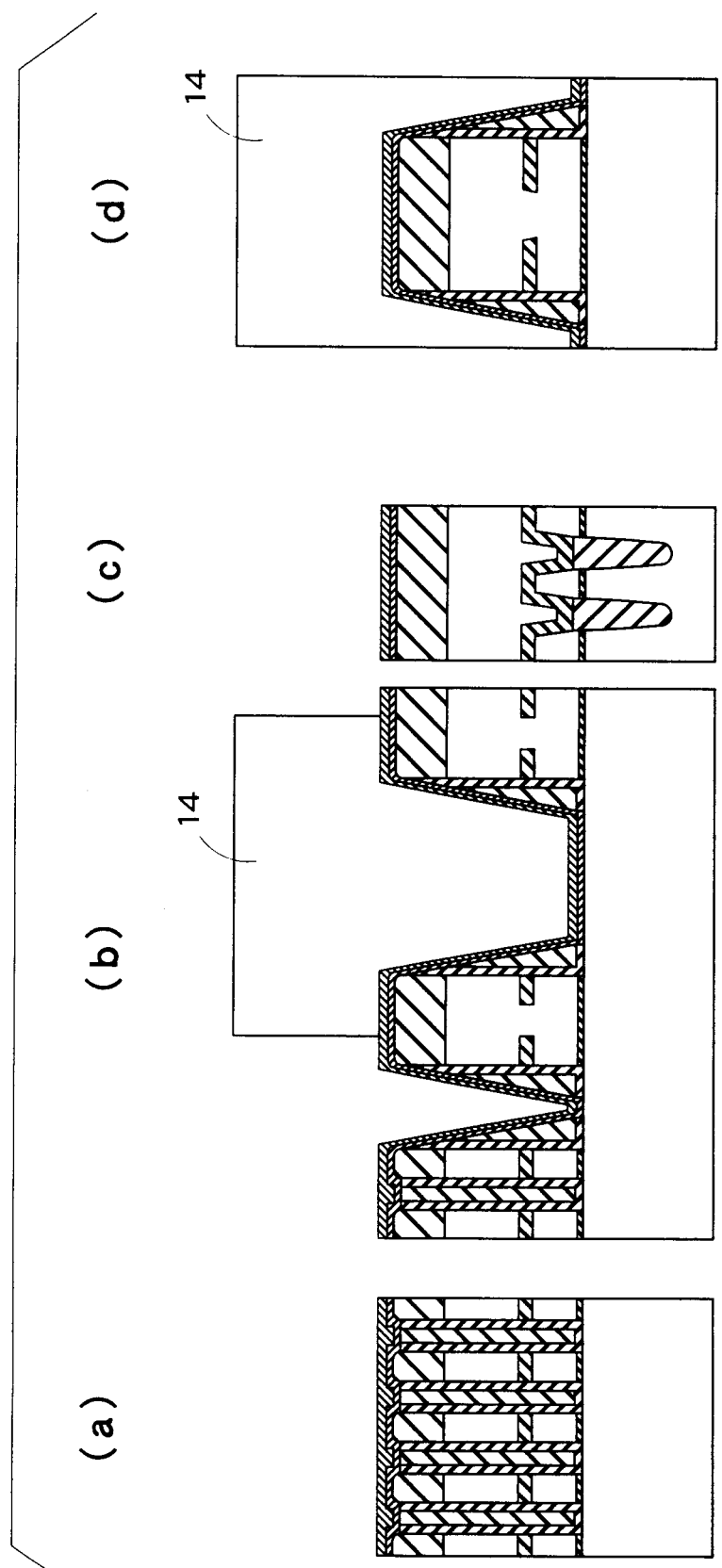
FIG. 4 is a sectional view showing a step subsequent to FIG. 3.
Figure 7:
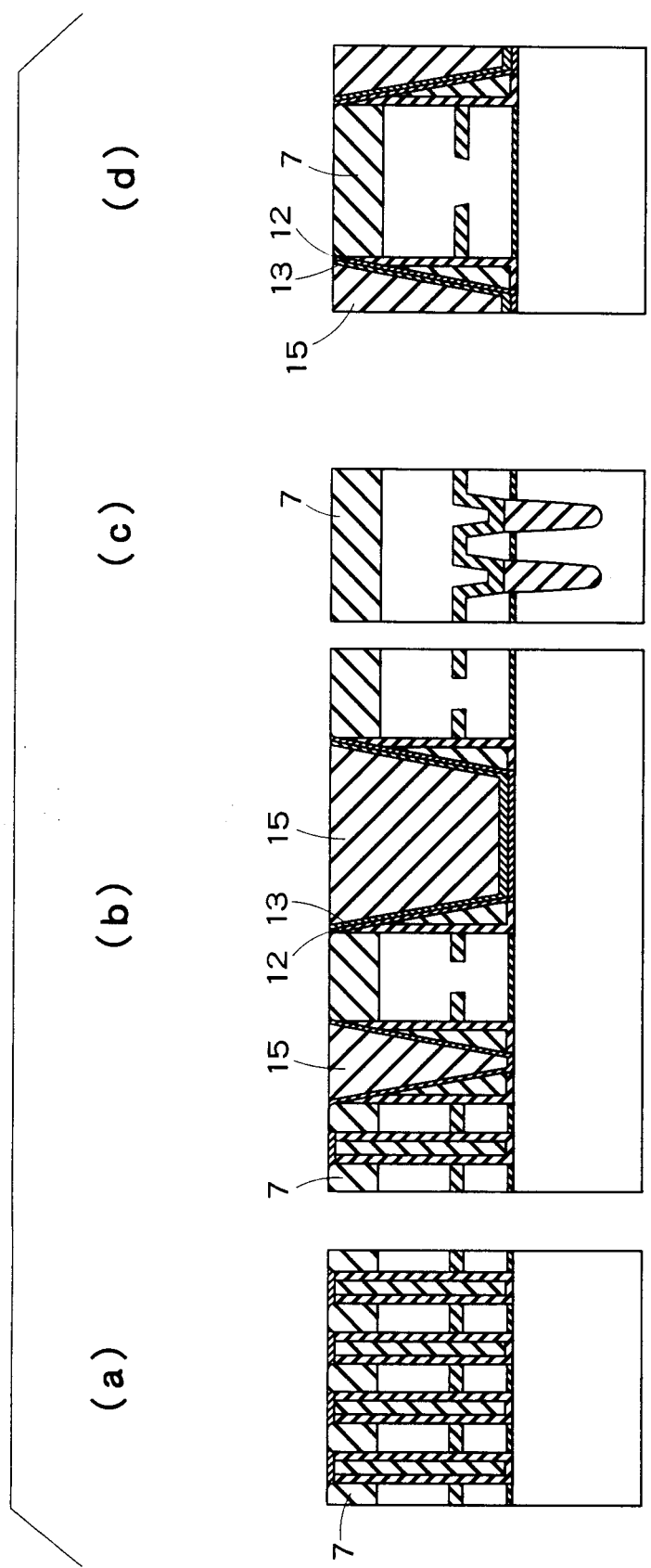
FIG. 7 is a sectional view showing a step subsequent to FIG. 6.
Figure 8:
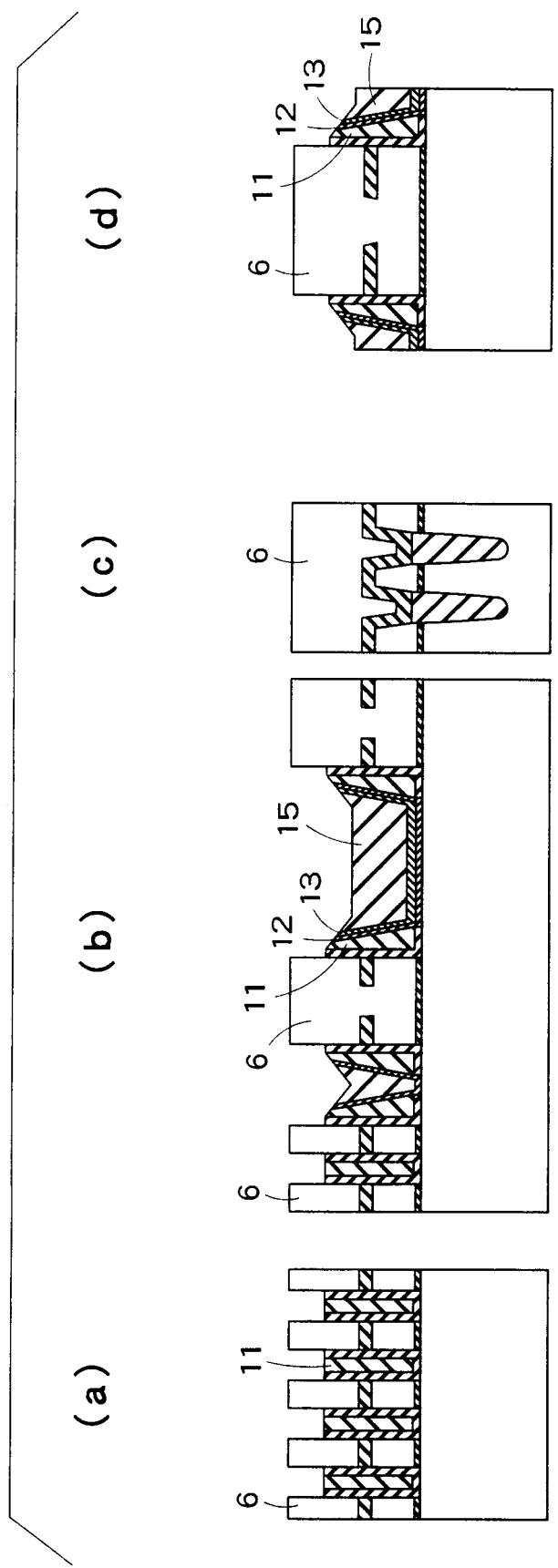
FIG. 8 is a sectional view showing a step subsequent to FIG. 7.
Figure 9:
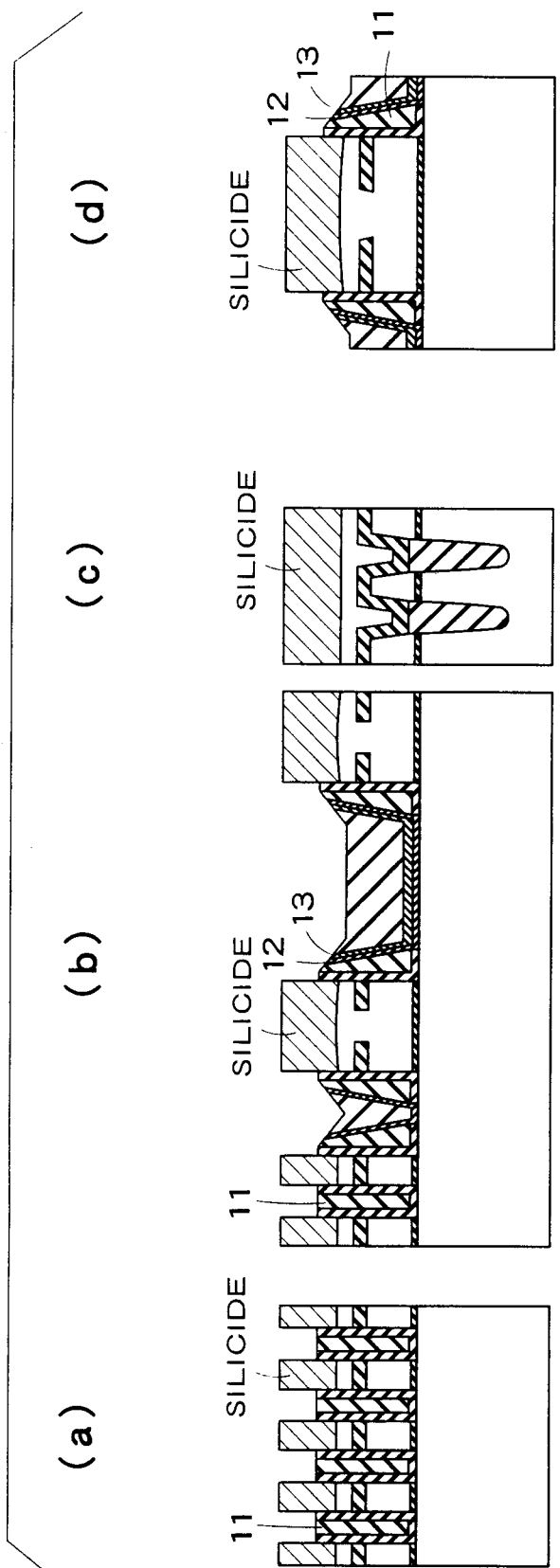
FIG. 9 is a sectional view showing a step subsequent to FIG. 8.
Figure 10:
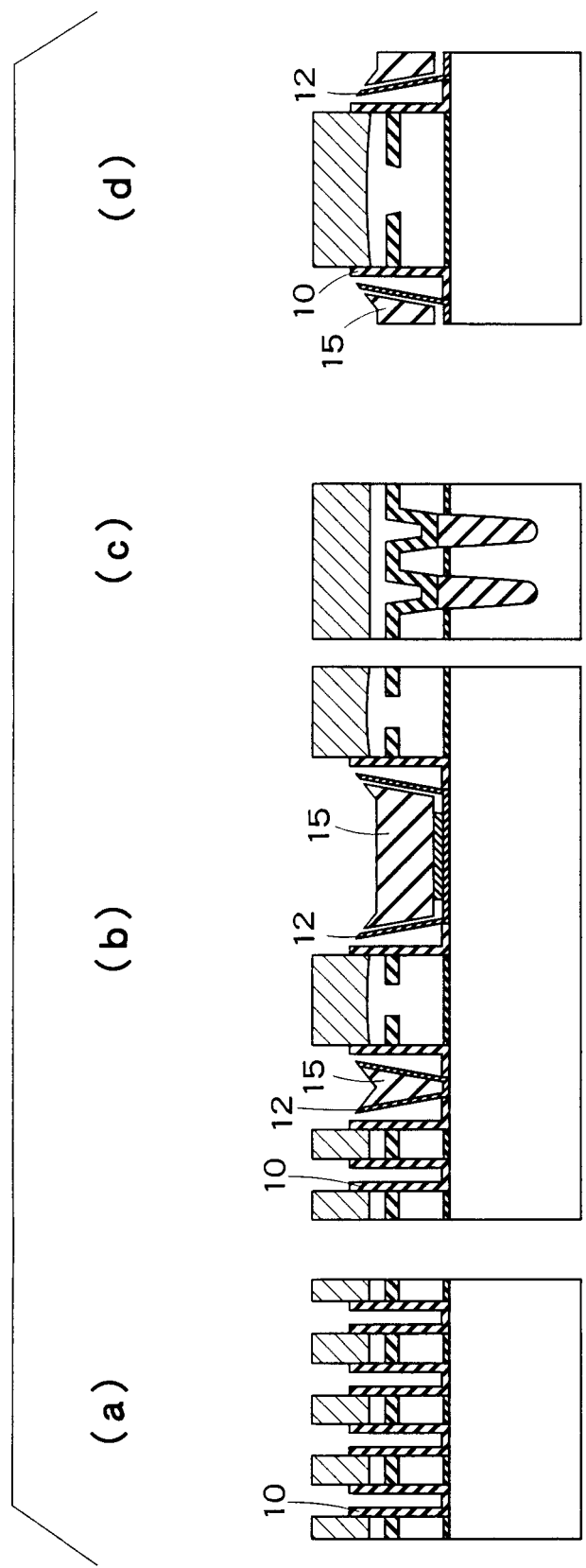
FIG. 10 is a sectional view showing a step subsequent to FIG. 9.
Figure 11:
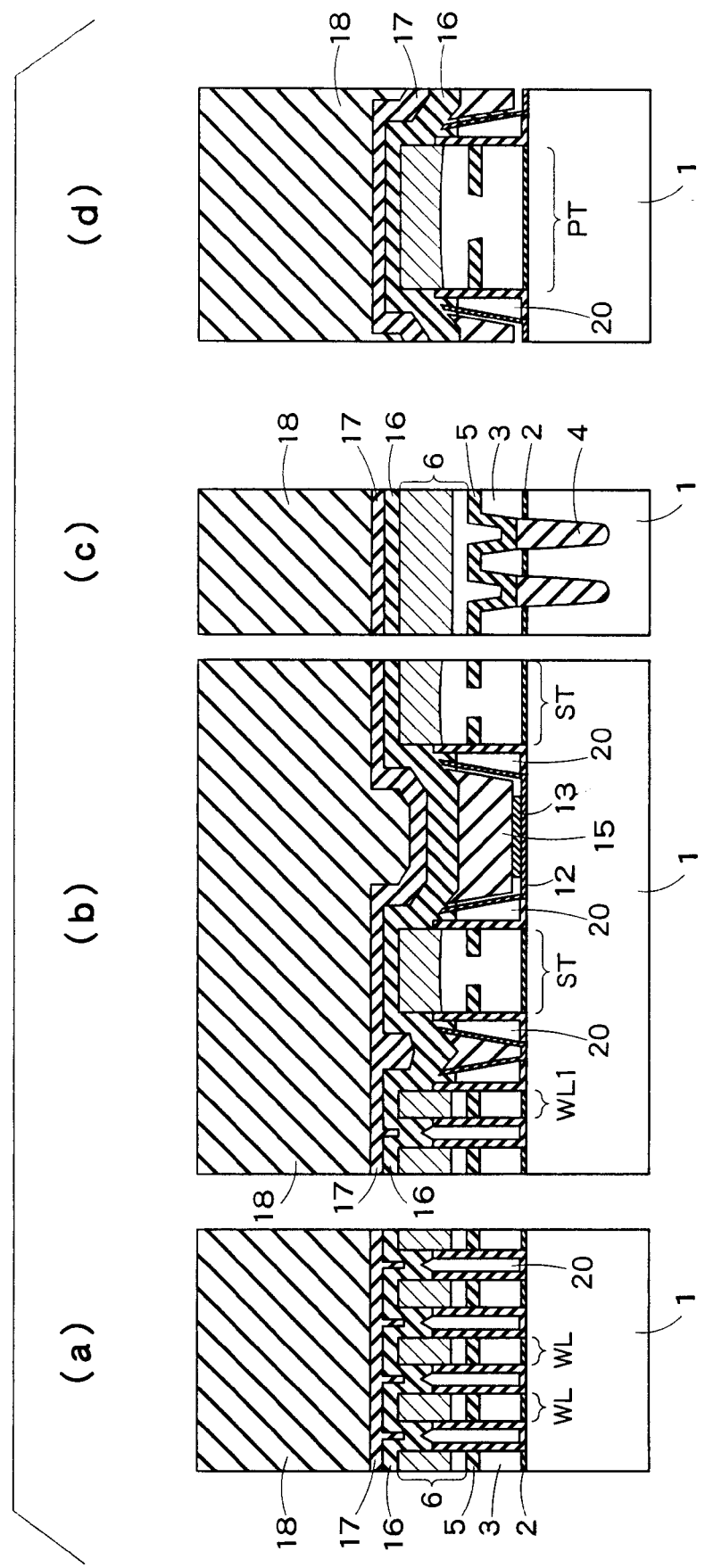
FIG. 11 is a sectional view showing a step subsequent to FIG. 10.

FIGS. 1(a) to 1(d) to FIGS. 11(a) to 11(d) show process sectional views for explaining a method for manufacturing a semiconductor memory device according to a first embodiment of the present invention. Of FIGS. 1(a) to 11(d), ones whose figure numbers end with (a) each show a vertical section of a memory cell array portion along a bit line direction, ones whose figure numbers end with (b) each show a vertical section of a memory cell array end portion and selecting gate transistors along the bit line direction, ones whose figure numbers end with (c) each show a vertical section of the memory cell array portion along a word line direction, and ones whose figure numbers end with (d) each show a vertical section of a peripheral transistor.

As shown in FIGS. 1(a) to 1(d), after a word line which is composed of a tunnel oxide film 2, a floating gate electrode 3, an interpoly insulating film 5, a controlling gate electrode 6, and a silicon nitride film 7 is fabricated, a spacer oxide film (silicon oxide film) 10 is formed, and impurity implantation is performed, thereby forming a diffusion layer (not shown) at the surface of a part of a semiconductor substrate 1.

A sacrificial nitride film (silicon nitride film) 11 is formed such that the sacrificial nitride film covers the spacer oxide film 10, and a space between each pair of adjacent ones of word lines WL is filled with the sacrificial nitride film 11. The spacer oxide film 10 and sacrificial nitride film 11 are preferably formed by ALD (atomic layer deposition). The sacrificial nitride film 11 may be formed by LP-CVD or plasma CVD.

The word line fabrication can be performed by a known method. For example, the tunnel oxide film 2 made of a silicon oxide film and the floating gate electrode 3 made of a polysilicon film are formed on the semiconductor substrate 1.

The floating gate electrode 3, tunnel oxide film 2, and semiconductor substrate 1 are partially removed at predetermined intervals along a first direction (the bit line direction), thereby forming trenches. The trenches are filled with a silicon oxide film to a predetermined height, thereby forming element isolating regions (STI) 4.

The interpoly insulating film 5 is formed to cover the floating gate electrodes 3 and element isolating regions 4, and a first polysilicon film is formed on the interpoly insulating film 5. The first polysilicon film and interpoly insulating film 5 are partially removed at a predetermined position in each of a region where a selecting transistor ST is to be formed and a region where a peripheral transistor PT is to be formed, thereby forming a trench. A second polysilicon film is formed on the first polysilicon film such that the trench is filled with the second polysilicon film.

In each memory cell array portion, the controlling gate electrode 6 is composed of the first polysilicon film and second polysilicon film. The selecting gate transistor ST and peripheral transistor PT each have an etching interpoly structure in which the polysilicon films (electrode layers) on the upper and lower surfaces of the interpoly insulating film 5 are connected to each other.

The silicon nitride film 7 is formed on the controlling gate electrode 6. Word lines can be fabricated by partially removing the silicon nitride film 7, controlling gate electrode 6, interpoly insulating film 5, floating gate electrode 3, and tunnel oxide film 2 at predetermined intervals along a second direction (the word line direction) which is orthogonal to the first direction.

A spacing L1 between the selecting transistor ST and a word line WL1 adjacent to the selecting transistor ST is set to be not less than three times a width L2 at the bottom of each word line. The selecting transistor ST is arranged at each end of the set of word lines WL.

As shown in FIGS. 2(a) to 2(d), the sacrificial nitride film 11 is etched back by RIE (reactive ion etching), thereby forming side walls (side wall films) SW at side wall portions of each selecting transistor ST, side wall portions of each peripheral transistor PT, and a side wall portion of each word line WL1 which faces the side wall portion of the selecting transistor ST. The side wall SW is composed of the sacrificial nitride film 11 and spacer oxide film 10.

The etchback partially removes the spacer oxide film 10, and the upper surface of each silicon nitride film 7, the surface of a part of the semiconductor substrate 1 between each pair of adjacent ones of the selecting gate transistors ST, and the surface of a part of the semiconductor substrate 1 between each selecting gate transistor ST and the corresponding word line WL1 are exposed.

As shown in FIGS. 3(a) to 3(d), a liner oxide film (silicon oxide film) 12 and a stopper nitride film 13 for contact formation (silicon nitride film) are formed.

As shown in FIGS. 4(a) to 4(d), a resist 14 is formed, and an opening is formed only in each memory cell array portion by lithographic processing.

As shown in FIGS. 5(a) to 5(d), a part of the stopper nitride film 13 for contact formation in each memory cell array portion is etched back and removed using the liner oxide film 12 as a stopper.

As shown in FIGS. 6(a) to 6(d), the resist 14 is removed. A process which is a combination of ashing, SPM (sulfuric peroxide mixture) cleaning, and APM (ammonia peroxide mixture) cleaning is used to remove the resist 14.

As shown in FIGS. 7(a) to 7(d), a silicon oxide film is deposited by LP-CVD to fill recesses, thereby forming an interlayer oxide film 15. Planarization processing is performed by CMP (chemical mechanical polishing) using the silicon nitride films 7 as a stopper.

As shown in FIGS. 8(a) to 8(d), the silicon nitride films 7 are removed by RIE, and the upper surfaces of the controlling gate electrodes 6 are exposed. At the time of removing the silicon nitride films 7, the liner oxide films 12, stopper nitride films 13 for contact formation, and interlayer oxide films 15 are slightly removed.

As shown in FIGS. 9(a) to 9(d), some or all of the controlling gate electrodes 6 are silicided. Any of Group IV to Group XI transition metals such as Ni, Ti, Co, Pt, Pd, Ta, and Mo can be used as a silicide metal material.

As shown in FIGS. 10(a) to 10(d), the sacrificial nitride films 11 are removed by wet etching or CDE (chemical dry etching). At this time, each stopper nitride film 13 for contact formation is also removed except for a part at the bottom of the interlayer oxide film 15 between the selecting gate transistors ST.

The remaining piece of the stopper nitride film 13 for contact formation functions as a stopper when a contact hole is made in a later bit line contact forming process.

As shown in FIGS. 11(a) to 11(d), a silicon oxide film 16 is formed by plasma CVD. Since plasma CVD is a deposition method with a poor filling ability, spaces left after the sacrificial nitride films 11 and stopper nitride films 13 for contact formation are removed are not filled with the silicon oxide film 16, and the spaces can be made to serve as cavities (air gaps) 20. An interlayer insulating film 17 and an interlayer insulating film 18 are formed on the silicon oxide film 16.

In the above-described manner, the cavities 20 can be formed between each pair of adjacent ones of the word lines WL, at a side wall portion of each word line WL1 adjacent to the selecting gate transistor ST which is on the selecting gate transistor ST side, at side wall portions of each selecting gate transistor ST, and at side wall portions of each peripheral transistor PT.

Since cavities are present between each pair of adjacent ones of the word lines WL and at a side wall portion of the word line WL1 at each end of each set of word lines WL which is on the corresponding selecting gate transistor ST side, it is possible to reduce parasitic capacitance or parasitic fringe capacitance between the floating gate electrodes and increase the operating speed of each memory cell.

The large spacing between each selecting gate transistor ST and the word line WL1 adjacent thereto and cavities at side wall portions of each selecting gate transistor ST reduce a GIDL current and prevent an abnormal cutoff.

As described above, according to this embodiment, operating speed increases, and a reliable semiconductor memory device can be obtained.

In the above-described embodiment, the sacrificial nitride films 11 are removed after the controlling gate electrodes 6 are silicided, as shown in FIGS. 9(a) to 9(d) and FIGS. 10(a) to 10(d). However, silicidation of the controlling gate electrodes 6 may be performed after the sacrificial nitride films 11 are removed.

Second Embodiment

Figure 14:
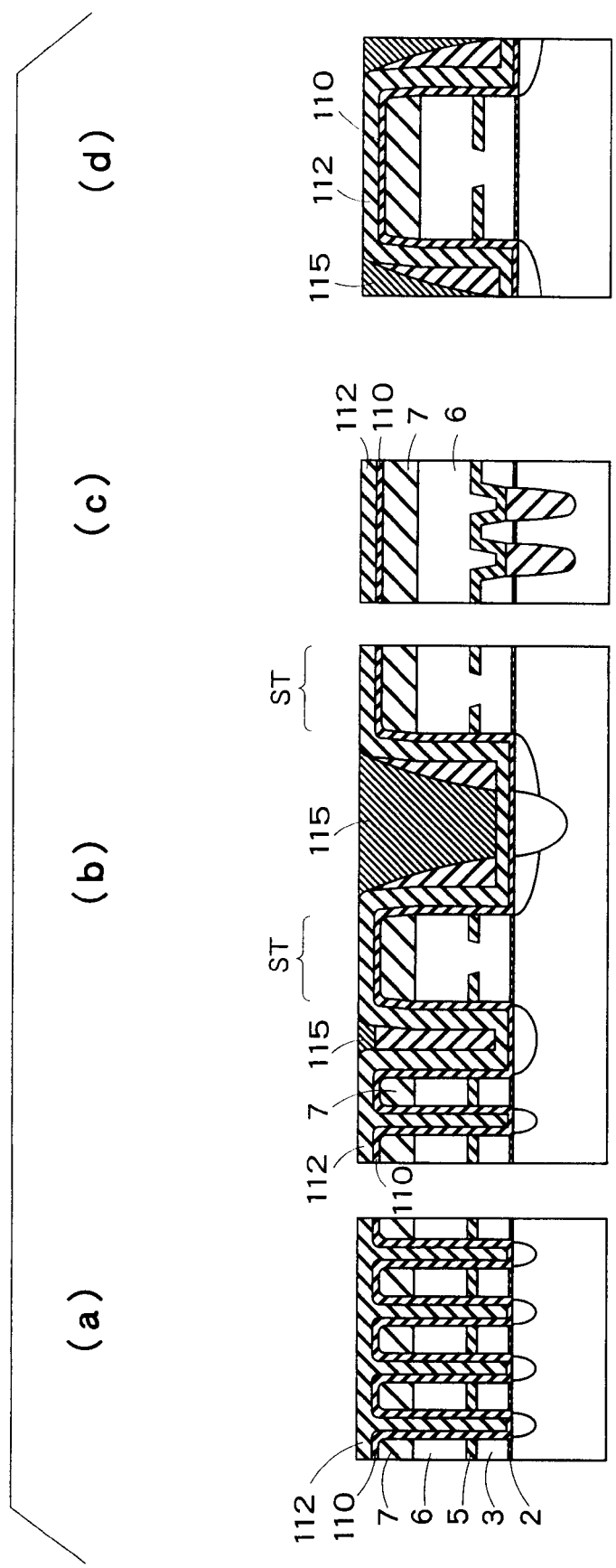
FIG. 14 is a sectional view showing a step subsequent to FIG. 13.

FIGS. 12(a) to 12(d) to FIGS. 18(a) to 18(d) show process sectional views for explaining a method for manufacturing a semiconductor memory device according to a second embodiment of the present invention. As in the first embodiment, of FIGS. 12(a) to 18(d), ones whose figure numbers end with (a) each show a vertical section of a memory cell array portion along a bit line direction, ones whose figure numbers end with (b) each show a vertical section of a memory cell array end portion and a selecting gate transistor along the bit line direction, ones whose figure numbers end with (c) each show a vertical section of the memory cell array portion along a word line direction, and ones whose figure numbers end with (d) each show a vertical section of a peripheral transistor.

As shown in FIGS. 12(a) to 12(d), after a word line which is composed of a tunnel oxide film 2, a floating gate electrode 3, an interpoly insulating film 5, a controlling gate electrode 6, and a silicon nitride film 7 is fabricated, a spacer oxide film (silicon oxide film) 110 is formed, and ions of, e.g., P or As are implanted at a dose of $1\times10^{13}$ ions/cm$^2$ using the spacer oxide film 110 as a mask, thereby forming a lightly-doped diffusion layer 111 at the surface of a part of a semiconductor substrate 1.

A stopper nitride film (silicon nitride film) 112 is formed by, e.g., ALD such that the stopper nitride film 112 covers the spacer oxide film 110, and a space between each pair of adjacent ones of word lines WL is filled with the stopper nitride film 112. The stopper nitride film 112 is preferably formed by ALD. A spacer oxide film 113 is formed such that the spacer oxide film 113 covers the stopper nitride film 112, and a space between a selecting gate transistor ST and a word line adjacent thereto is filled with the spacer oxide film 113.

Like the first embodiment, the word line fabrication can be performed by a known method. A spacing L1 between each selecting transistor ST and the word line WL1 adjacent to the selecting transistor ST is set to be not less than three times a width L2 of each word line.

As shown in FIGS. 13(a) to 13(d), the spacer oxide film 113 is etched back by RIE, thereby forming a side wall (side wall film) SW which is composed of the spacer oxide film 113, stopper nitride film 112, and spacer oxide film 110. At the time of the RIE processing, the stopper nitride film 112 protects the lightly-doped diffusion layer 111.

Ions of, e.g., As are implanted at a dose of $1\times10^{13}$ ions/cm$^2$ using the side walls (side wall films) SW as a mask, thereby forming a heavily-doped diffusion layer 114 at the surface of a part between each pair of adjacent ones of the selecting gate transistors ST of the semiconductor substrate 1 to have an LDD (lightly doped drain) structure.

As shown in FIGS. 14(a) to 14(d), a silicon oxide film is deposited by CVD to fill spaces between the selecting gate transistors, thereby forming an interlayer oxide film 115. The interlayer oxide film 115 is planarized by CMP using a part above the controlling gate electrodes 6 of the stopper nitride film 112 as a stopper.

As shown in FIGS. 15(a) to 15(d), parts above the controlling gate electrodes 6 of the stopper nitride film 112 and liner oxide film 110 and the silicon nitride films 7 are removed by RIE such that the upper surfaces of the controlling gate electrodes 6 are exposed. At this time, the interlayer oxide film 115 is also partially removed.

As shown in FIGS. 16(a) to 16(d), removal of the stopper nitride films 112 is performed by any of wet etching, CDE, and RIE. At this time, a part of the stopper nitride film 112 at the bottom of the interlayer oxide film 115 between each pair of adjacent ones of the selecting gate transistors ST remains unremoved. That is, the rest of the stopper nitride film 112 serving as components of the side walls SW is removed.

A part of the stopper nitride film 112 at the bottom of the spacer oxide film 113 between each selecting gate transistor ST and the word line WL1 adjacent thereto can also remain unremoved.

As shown in FIGS. 17(a) to 17(d), some or all of the controlling gate electrodes 6 are silicided. Any of Group IV to Group XI transition metals such as Ni, Ti, Co, Pt, Pd, Ta, and Mo can be used as a silicide metal material.

As shown in FIGS. 18(a) to 18(d), a silicon oxide film 116 is formed by plasma CVD. Since plasma CVD is a deposition method with a poor filling ability, spaces left after the stopper nitride films 112 are removed are not filled with the silicon oxide film 116, and the spaces can be made to serve as cavities (air gaps) 120.

In the above-described manner, the cavities 120 can be formed between each pair of adjacent ones of the word lines WL, at a side wall portion of each word line WL1 adjacent to the selecting gate transistor ST which is on the selecting gate transistor ST side, at side wall portions of each selecting gate transistor ST, and at side wall portions of each peripheral transistor PT.

Since cavities are present between each pair of adjacent ones of the word lines WL and at a side wall portion of the word line WL1 at each end of each set of word lines WL which is on the corresponding selecting gate transistor ST side, it is possible to reduce parasitic capacitance or parasitic fringe capacitance between the floating gate electrodes and increase the writing speed of each memory cell.

The large spacing between each selecting gate transistor ST and the word line WL1 adjacent thereto and cavities at side wall portions of each selecting gate transistor ST reduce a GIDL current and prevent an abnormal cutoff.

Since, at the time of forming the side walls SW shown in FIGS. 13(a) to 13(d), the stopper nitride film 112 protects each lightly-doped diffusion layer 111, the lightly-doped diffusion layer 111 can be prevented from being scraped. For this reason, an increase in resistance value of the diffusion layer between each selecting gate transistor ST and the corresponding word line WL1 is suppressed, and a high cell current can be assured.

The part of the stopper nitride film 112 remaining at the bottom of the interlayer oxide film 115 between each pair of adjacent ones of the selecting gate transistors ST functions as a stopper when a contact hole is made in bit line contact formation. That is, the stopper nitride film 112 according to this embodiment functions as a sacrificial layer for forming a cavity (air gap) and also functions as a stopper for contact hole formation.

As described above, according to this embodiment, operating speed increases, and a reliable semiconductor memory device with an assured high cell current can be obtained.

The semiconductor memory devices in the first and second embodiments each have a floating gate structure in which charge is accumulated in a floating gate electrode. The present invention, however, can also be applied to a nitride film trap type MONOS structure or SONOS structure.

What is claimed is:

1. A semiconductor memory device comprising:
   a semiconductor substrate;
   a plurality of word lines formed on the semiconductor substrate at predetermined intervals, each of the word lines having a first word line insulating film, a charge accumulating layer, a second word line insulating film, and a controlling gate electrode stacked in sequence;
   selecting transistors arranged on at least one side of the plurality of word lines;
   an interlayer insulating film formed to cover upper surfaces of the word lines and the selecting transistors;
   a first air gap located between a pair of adjacent word lines, the first air gap being separated from the pair of adjacent word lines by a first spacer insulating film and covered by the interlayer insulating film;
   a second air gap located at a first side wall portion of a word line adjacent to the selecting transistors, the first side wall portion facing the selecting transistors, and the second air gap being separated from the first side wall portion by a second spacer insulating film and covered by the interlayer insulating film; and a third air gap located at a second side wall portion of one of the selecting transistors, the second side wall portion being opposite to one of the word lines, and the third air gap being separated from the second side wall portion by a third spacer insulating film and covered by the interlayer insulating film, wherein a distance between the word lines is smaller than a distance between the selecting transistors, the first, second, and third air gaps are filled with air, and a size of the first air gap is larger than a size of the third air gap.

2. The semiconductor memory device according to claim 1, further comprising a peripheral transistor formed on the semiconductor substrate, wherein a fourth air gap whose upper portion is covered with the interlayer insulating film is provided at a side wall portion of a gate electrode of the peripheral transistor.

3. The semiconductor memory device according to claim 1, further comprising a fourth air gap which is formed at a side portion of the third air gap through an oxide film and whose upper portion is covered with the interlayer insulating film.

4. The semiconductor memory device according to claim 1, further comprising a peripheral transistor formed on the semiconductor substrate, wherein a fifth air gap whose upper portion is covered with the interlayer insulating film is provided at a side wall portion of a gate electrode of the peripheral transistor.

5. The semiconductor memory device according to claim 1, further comprising a sixth air gap which is formed at a side wall portion of one of the selecting transistors, which faces one of the word lines and whose upper portion is covered with the interlayer insulating film.

6. The semiconductor memory device according to claim 1, wherein a diffusion layer of the selecting transistors at the second side wall portion is a lightly doped drain (LDD) structure.

7. The semiconductor memory device according to claim 6, wherein the LDD structure has a lightly-doped diffusion layer and a heavily-doped diffusion layer, and the heavily-doped diffusion layer is formed by using the second side wall portion as a mask.

* * * * *